United States Patent
Mo et al.

(10) Patent No.: US 9,054,748 B2
(45) Date of Patent: *Jun. 9, 2015

(54) RECONFIGURABLE WIDEBAND RECEIVER

(71) Applicant: Aviacomm Inc., Sunnyvale, CA (US)

(72) Inventors: Shih Hsiung Mo, San Jose, CA (US); Yan Cui, Plano, TX (US); Chung-Hsing Chang, Milpitas, CA (US)

(73) Assignee: AVIACOMM INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/250,195

(22) Filed: Apr. 10, 2014

(65) Prior Publication Data

US 2014/0220921 A1    Aug. 7, 2014

Related U.S. Application Data

(63) Continuation of application No. 13/363,083, filed on Jan. 31, 2012, now Pat. No. 8,706,071.

(60) Provisional application No. 61/527,008, filed on Aug. 24, 2011.

(51) Int. Cl.
*H04B 1/26* (2006.01)
*H04B 1/00* (2006.01)
*H04L 27/38* (2006.01)
*H03D 7/16* (2006.01)
*H04B 1/10* (2006.01)

(52) U.S. Cl.
CPC .............. *H04B 1/0053* (2013.01); *H04L 27/38* (2013.01); *H03D 7/165* (2013.01); *H03D 2200/0017* (2013.01); *H03D 2200/005* (2013.01)

(58) Field of Classification Search
CPC ........................................................ H04B 1/30
USPC .................. 455/313, 323, 324, 334, 337, 339
See application file for complete search history.

(56) References Cited

U.S. PATENT DOCUMENTS

| 8,706,071 B2 * | 4/2014 | Mo et al. ........................ 455/324 |
| 2005/0186935 A1 | 8/2005 | Kawama et al. |
| 2007/0001881 A1 | 1/2007 | Piovaccari |

* cited by examiner

*Primary Examiner* — Lee Nguyen
(74) *Attorney, Agent, or Firm* — Shun Yao; Park, Vaughan, Fleming & Dowler LLP

(57) ABSTRACT

One embodiment of the present invention provides a receiver for wireless communication. The receiver includes a demodulator and at least one filtering mechanism coupled to the demodulator, and an analog-to-digital converter (ADC) coupled to the filtering mechanism. The filtering mechanism can be configured to function as a low-pass filter (LPF) or a band-pass filter (BPF), thereby enabling the receiver to function as a direct-conversion receiver or a low-intermediate frequency (low-IF) receiver.

8 Claims, 2 Drawing Sheets

RECONFIGURABLE WIDEBAND RECEIVER

RELATED APPLICATION

This application is a continuation of U.S. application Ser. No. 13/363,083, entitled "RECONFIGURABLE WIDEBAND RECEIVER," by inventors Shih Hsiung Mo, Yan Cui, and Chung-Hsing Chang, filed 31 Jan. 2012, which claims the benefit of U.S. Provisional Application No. 61/527,008, entitled "Reconfigurable Wideband Receiver," by inventors Shih Hsiung Mo, Yan Cui, and Chung-Hsing Chang, filed 24 Aug. 2011.

BACKGROUND

1. Field

The present disclosure relates generally to receivers in a wireless system. More specifically, the present disclosure relates to a wideband receiver that can be reconfigured between a direct-conversion receiver and a low-intermediate frequency (IF) receiver.

2. Related Art

Traditional wireless communication systems are usually designed for a specific standard, such as GSM (Global System for Mobile Communications) or Wideband Code Division Multiple Access (W-CDMA), each requiring different carrier frequencies. For example, the carrier frequency of the GSM signals varies from 800 MHz to 1 Ghz, while the carrier frequency of the W-CDMA signals varies between 2-3 GHz. Current demand for the convergence of wireless services, in which users can access different standards from the same wireless device, is driving the development of multi-standard and multi-band transceivers, which are capable of transmitting/receiving radio signals in the entire wireless communication spectrum (from 300 MHz to 3.6 GHz).

SUMMARY

One embodiment of the present invention provides a receiver for wireless communication. The receiver includes a demodulator and at least one filtering mechanism coupled to the demodulator, and an analog-to-digital converter (ADC) coupled to the filtering mechanism. The filtering mechanism can be configured to function as a low-pass filter (LPF) or a band-pass filter (BPF), thereby enabling the receiver to function as a direct-conversion receiver or a low-intermediate frequency (low-IF) receiver.

In a variation of this embodiment, the demodulator is a quadrature demodulator that includes an in-phase (I) channel output and a quadrature (Q) channel output.

In a further variation, the filtering mechanism includes a cross-coupled filter comprising a first LPF and a second LPF that are cross-coupled by a first feedback circuit and a second feedback circuit.

In a further variation, an output of the first LPF is coupled to an input of the second LPF via the first feedback circuit, and an output of the second LPF is coupled to an input of the first LPF via the second feedback circuit.

In a further variation, the first and/or the second feedback circuit includes a resistor and an on-off switch.

In a further variation, a resistance of the resistor is at least 10 times an input resistance of the ADC.

In a further variation, the receiver includes a control circuit configured to control opening and closing of the on-off switch based on an active wireless communication standard.

In a further variation, the active wireless communication standard includes one of: Global System for Mobile Communications (GSM); Code Division Multiple Access (CDMA); Wideband-CDMA (W-CDMA); and Long Term Evolution (LTE).

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview

Embodiments of the present invention provide a wideband wireless receiver that can be configured as a direct-conversion receiver or a low-IF (intermediate frequency) receiver. By introducing feedback loops between the I and Q channels, embodiments of the present invention enable conversion between low-pass filters (LPFs) and band-pass filters (BPFs), thus the conversion between the direct-conversion receiver and a low-IF receiver.

Reconfigurable Receiver

A direct-conversion receiver directly demodulates an RF (radio frequency) modulated carrier to baseband frequencies. This is in contrast to the standard super-heterodyne receiver where an initial conversion to an intermediate frequency (IF) is needed. The simplicity of performing only a single frequency conversion reduces the basic circuit complexity, and is thus preferable for today's wireless communication where high-density integrated circuits (ICs) are needed.

Figure 1:
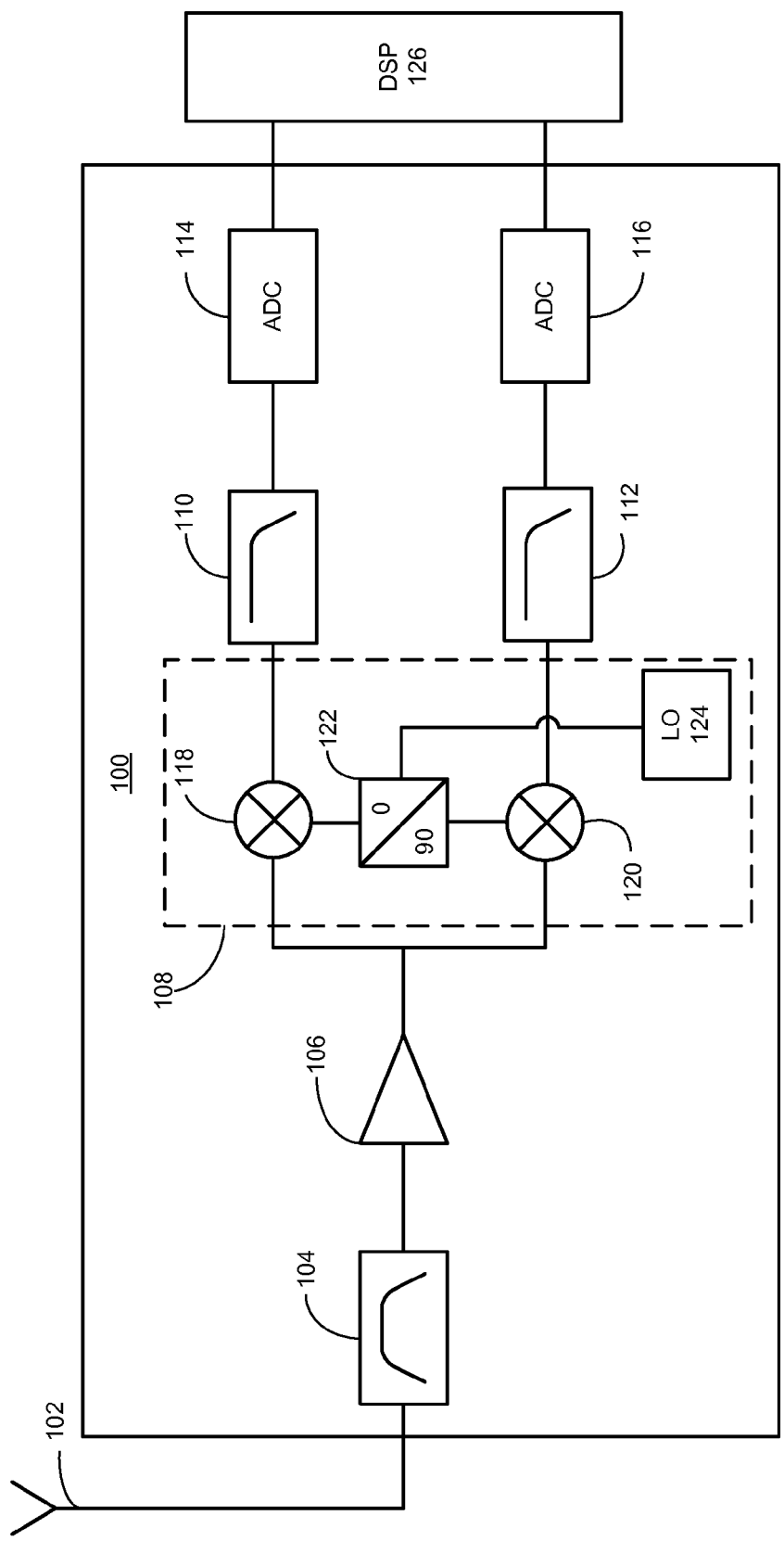
FIG. 1 presents a diagram illustrating the architecture of a conventional direction-conversion receiver (prior art).

FIG. 1 presents a diagram illustrating the architecture of a conventional direct-conversion receiver (prior art). Direct-conversion receiver 100 includes a band-pass filter (BPF) 104, an amplifier 106, an IQ (in-phase quadrature) demodulator 108, low-pass filters (LPFs) 110 and 112, and analog-to-digital converters (ADCs) 114 and 116. IQ demodulator 108 includes mixers 118 and 120, 90°/0° phase shifter 122, and local oscillator (LO) 124.

During operation, incoming RF signals (which may include GSM signals at a frequency band around 800 MHz and RF signals at other frequency ranges) received via an antenna 102 are filtered and amplified by BPF 104 and amplifier 106, respectively. In one embodiment, BPF 104 is tunable, and depending on the standard (such as GSM or W-CDMA) that is currently active, BPF 104 provides filtering at the desired RF frequency band. In one embodiment, BPF 104 includes a group of BPFs, each corresponding to a particular frequency band. Depending on the standard, one of the BPFs is selected to filter the desired RF signal. Subsequently, the filtered RF signal is directly down-converted to in-phase (I) and quadrature (Q) baseband signals by IQ demodulator 108. Note that LO 124 is applied to I and Q mixers 118 and 120 at the same carrier frequency as the desired signal, thus generating the sum and difference frequencies at the baseband I/Q output ports. LPFs 110 and 112 heavily reject the summation frequency and allow only signals at the difference frequency (the baseband signals) to pass. ADCs 114 and 116 convert the I and Q baseband signals to the digital domain before sending them to a baseband digital signal processor (DSP) 126 for further processing.

Although direct-conversion receivers have provided more freedom in addressing multiple bands of operation using a single hardware solution, they also encounter a number of problems, including inability to reject DC offset and flicker noise (or 1/f noise). These problems are worsened when the bandwidth of the incoming signals is relatively narrow, which results in the demodulated baseband signal having a large percentage of spectrum close to DC. For example, the bandwidth of typical GSM signals is around tens of kilohertz; hence, the demodulated GSM baseband signal has a narrow spectrum ranging from DC to tens of kilohertz. Consequently, DC offset and flicker noise will have a greater negative impact. To mitigate problems caused by DC offset and flicker noise, it is desirable to move the spectrum of the demodulated signal away from DC. To do so, a low-IF receiver can be used to receive signals with narrow bandwidth.

The architecture of a low-IF receiver is similar to that of the direct-conversion receiver, except that the filtered RF signal is mixed down to a non-zero intermediate frequency, typically a few MHz. In general, low-IF receivers have many of the desirable properties of direct-conversion receivers, while avoiding the DC offset and flicker noise problems.

In order to provide a single hardware solution that can be used for both the wideband signals and the narrowband signals, embodiments of the present invention provide a receiver that can be configured as either a direct-conversion or a low-IF receiver. More specifically, when the desired signal is a narrowband signal (such as the GSM signal), the receiver can be configured as a low-IF receiver; and when the desired signal is a wideband signal (such as the W-CDMA signal), the receiver can be configured as a direct-conversion receiver.

Figure 2:
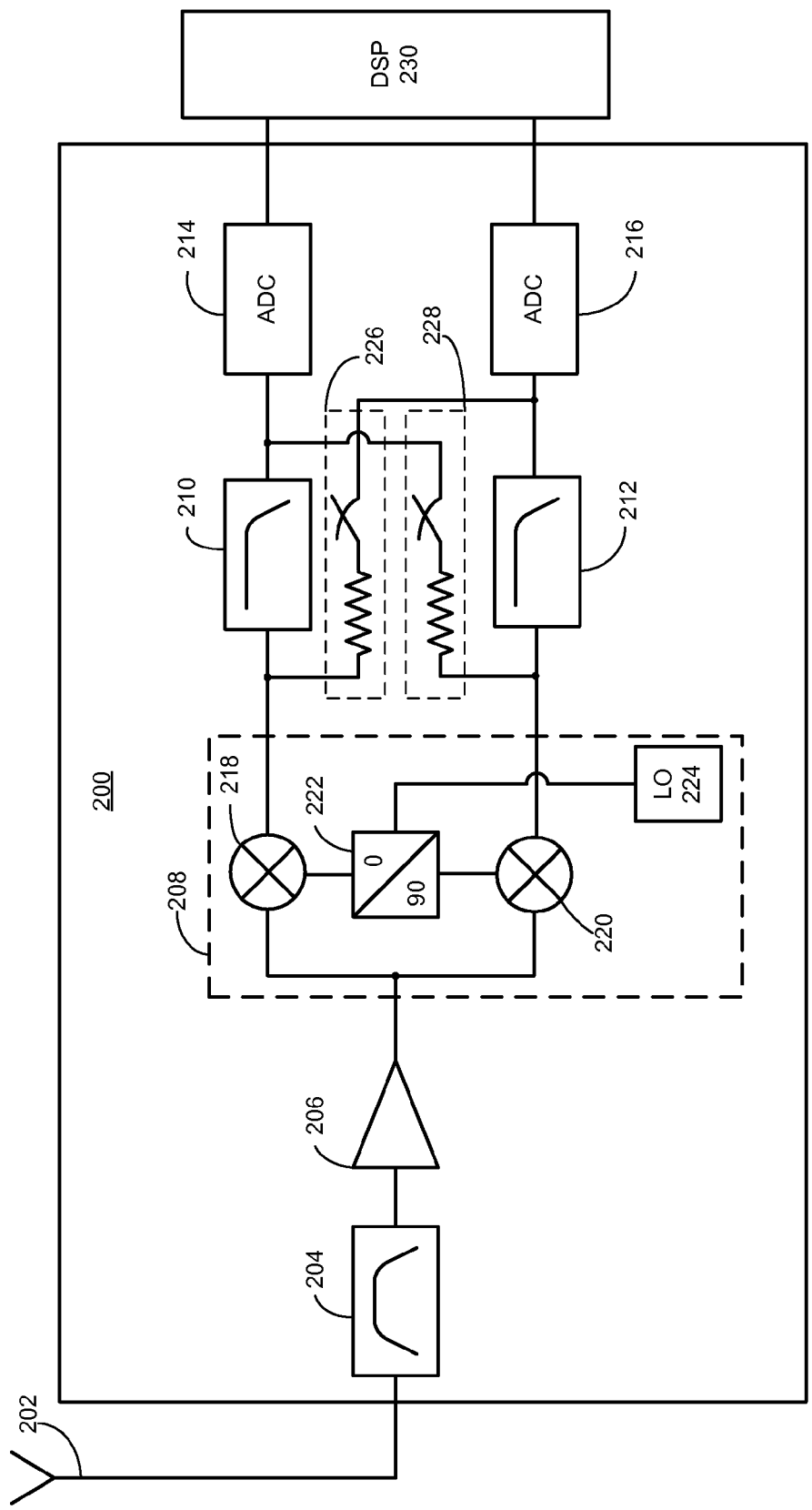
FIG. 2 presents a diagram illustrating the architecture of a receiver that is reconfigurable between direct-conversion and low-IF, in accordance with an embodiment of the present invention.

FIG. 2 presents a diagram illustrating the architecture of a receiver that is reconfigurable between direct-conversion and low-IF, in accordance with an embodiment of the present invention. The architecture of reconfigurable receiver 200 is similar to that of direct-conversion receiver 100. Reconfigurable receiver 200 includes a band-pass filter (BPF) 204, an amplifier 206, an IQ demodulator 208, low-pass filters (LPFs) 210 and 212, and analog-to-digital converters (ADCs) 214 and 216. IQ demodulator 208 includes mixers 218 and 220, 90°/0° phase shifter 222, and local oscillator (LO) 224. The difference between direct-conversion receiver 100 and reconfigurable receiver 200 is that reconfigurable receiver 200 includes feedback circuit loops 226 and 228, which couple the outputs of LPFs 210 and 212 to inputs of LPFs 212 and 210, respectively. Each feedback circuit loop includes a resistor and an on/off switch. In one embodiment, the resistance of these resistors is at least 10 times that of the input impedance of ADCs 214 and 216. For example, if the input impedance of ADCs 214 and 216 is 50 Ohm, then the resistance of resistors in feedback circuit loops 226 and 228 is at least 500 Ohm.

During operation, incoming RF signals received via an antenna 202 are filtered and amplified by BPF 204 and amplifier 206, respectively. When the desired RF signals are wideband signals (such as W-CDMA signals, depending on the active standard), the switches in feedback circuit loops 226 and 228 are open, and reconfigurable receiver 200 is configured as a regular direct-conversion receiver. The operation of reconfigurable receiver 200 in the direct-conversion mode is the same as that of direct-conversion receiver 100.

When the desired RF signals are narrowband signals (such as GSM signals, depending on the active standard) and flicker noise becomes a problem, or when noise bandwidth needs to be improved, it is desirable to have reconfigurable receiver 200 operating in the low-IF mode. In low-IF mode, the amplified signal is subsequently demodulated to a low-IF signal by IQ demodulator 208. To do so, LO 224 is applied to I and Q mixers 218 and 220 at a frequency that is slightly higher than the carrier frequency of the desired signal. The IF is the frequency difference between LO 224 and the carrier frequency of the desired signal. In one embodiment, this frequency difference is determined by the bandwidth of the desired signal. In a further embodiment, the IF is 20% higher than the bandwidth of the desired RF signal.

Note that it is possible to use LPFs in a low-IF receiver to reject the summation frequency. However, such LPFs often require a wider passing band. In addition, LPFs are not sufficient in rejecting image frequencies. Because it is difficult to implement LPFs with a relatively wider passing band (in the MHz range), it is desirable to use a band-pass filter (BPF) to select the IF signal while rejecting the summation frequency. When receiver 200 is in the low-IF mode, the switches in feedback circuit loops 226 and 228 are closed to enable cross-coupling between LPFs 210 and 212. Due to the 90° phase difference between the I and Q channels, LPFs 210 and 212, together with feedback circuits loops 226 and 228, form a cross-coupled filter. This cross-coupled filter can function as a BPF to select the IF signals, while rejecting the summation frequencies and other image frequencies for the I and Q channels. ADCs 214 and 216 convert the I and Q IF signals to the digital domain before sending them to a DSP 230 for further processing.

Note that opening and closing of the switches are controlled by a separate circuitry (not shown in FIG. 2). This control circuitry opens and closes the switches based on the bandwidth of the desired RF signals or based on the currently active standard. For example, if it is determined that the standard in use is GSM, the control circuitry closes the switches, and receiver 200 operates in low-IF mode. On the other hand, if it is determined that the standard in use is W-CDMA, the control circuitry opens the switches, and receiver 200 operates in direct-conversion mode. Receiver 200 can also be configured before being installed into a wireless device by an off-chip control circuitry. For example, if it is known that the wireless device is sold to a market implementing GSM, receiver 200 can be configured as a low-IF receiver.

The configurability of the receiver allows the receiver chip to accommodate various wireless communication standards, including, but not limited to: GSM, CDMA, W-CDMA, and Long Term Evolution (LTE). Therefore, it allows chip manufacturers to manufacture the same type of receiver chip that can be sold to different markets where different standards are implemented, thus significantly reducing the designing and manufacturing cost.

The example shown in FIG. 2 is for illustration purposes only and should not limit the scope of this disclosure. In general, embodiments of the present invention provide a receiver that can be configured as a direct-conversion receiver or a low-IF receiver. The circuit configuration shown in FIG. 2 is merely exemplary. Other configurations are also possible as long as the LPFs can be reconfigured to function as BPFs.

The foregoing descriptions of embodiments of the present invention have been presented only for purposes of illustration and description. They are not intended to be exhaustive or to limit this disclosure. Accordingly, many modifications and variations will be apparent to practitioners skilled in the art. The scope of the present invention is defined by the appended claims.

What is claimed is:

1. A receiver for wireless communication, comprising:
   an analog demodulator;
   a reconfigurable filtering mechanism coupled to the analog demodulator, wherein the reconfigurable filtering mechanism is configured to switch an operation mode between being a low-pass filter (LPF) and being a band-pass filter (BPF), thereby enabling the receiver to switch between being a direct-conversion receiver and being a low-intermediate frequency (low-IF) receiver; and
   an analog-to-digital converter (ADC) coupled to the filtering mechanism.

2. The receiver of claim 1, wherein the analog demodulator is a quadrature demodulator that includes an in-phase (I) channel output and a quadrature (Q) channel output.

3. The receiver of claim 2, wherein the reconfigurable filtering mechanism includes a cross-coupled filter comprising a first LPF and a second LPF that are cross coupled together by a first feedback circuit and a second feedback circuit.

4. The receiver of claim 3, wherein an output of the first LPF is coupled to an input of the second LPF via the first feedback circuit, and wherein an output of the second LPF is coupled to an input of the first LPF via the second feedback circuit.

5. The receiver of claim 3, wherein the first and/or the second feedback circuit includes a resistor and an on-off switch.

6. The receiver of claim 5, wherein a resistance of the resistor is at least 10 times an input resistance of the ADC.

7. The receiver of claim 5, further comprising a control circuit configured to control opening and closing of the on-off switch based on an active wireless communication standard.

8. The receiver of claim 7, wherein the active wireless communication standard includes one of:
   Global System for Mobile Communications (GSM);
   Code Division Multiple Access (CDMA);
   Wideband-CDMA (W-CDMA); and
   Long Term Evolution (LTE).

* * * * *